(12) United States Patent
Tsubaki

(10) Patent No.: US 6,465,905 B1
(45) Date of Patent: Oct. 15, 2002

(54) CONTROLLER INTEGRATED WITH ENGINE AND CIRCUIT BOARDS PACKAGE USED IN CONTROLLER

(75) Inventor: Akira Tsubaki, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 6 days.

(21) Appl. No.: 09/609,769

(22) Filed: Jul. 3, 2000

(30) Foreign Application Priority Data

Jul. 5, 1999 (JP) .......................................... 11-190901

(51) Int. Cl.[7] .................................................. B60L 1/00
(52) U.S. Cl. .................................. 307/10.1; 123/184.61
(58) Field of Search ...................... 307/10.1; 123/143 C, 123/184.61; 361/679, 728, 736, 478, 752, 760, 761

(56) References Cited

U.S. PATENT DOCUMENTS

| | | | |
|---|---|---|---|
| 4,050,093 A | * | 9/1977 | Crall et al. .................. 361/692 |
| 4,706,639 A | * | 11/1987 | Boyer et al. ................ 123/647 |
| 5,771,850 A | * | 6/1998 | Okada ..................... 123/143 C |
| 6,186,106 B1 | * | 2/2001 | Glovatsky et al. ...... 123/143 C |

FOREIGN PATENT DOCUMENTS

JP  10-325356  12/1998

* cited by examiner

Primary Examiner—Stephen W. Jackson
Assistant Examiner—Sharon Polk
(74) Attorney, Agent, or Firm—Finnegan, Henderson, Farabow, Garrett, & Dunner, L.L.P.

(57) ABSTRACT

A controller is integrated with an engine and provided to an engine cover that is mounted to an opening at an upper portion of the engine and closes the opening. The engine cover includes an engine cover lower portion mounted to the opening and an engine cover upper portion mounted to the engine cover lower portion and covering the obverse of the engine cover lower portion. The engine cover also covers one or more engine control components, and an engine control circuit, a circuit protecting component, and a power distributing board that are mounted to the engine cover lower portion. The one or more engine control components, the engine control circuit, the circuit protecting component, and the power distributing board are covered with the engine cover upper portion.

13 Claims, 7 Drawing Sheets

US 6,465,905 B1

CONTROLLER INTEGRATED WITH ENGINE AND CIRCUIT BOARDS PACKAGE USED IN CONTROLLER

BACKGROUND OF THE INVENTION

1. Field of the Invention

The present invention relates to a controller integrated with an engine in which engine control components are incorporated into an engine cover and relates to a circuit boards package used in the controller, and particularly relates to a controller integrated with an engine in which an engine control circuit is also incorporated into the engine cover and a circuit boards package used in the controller.

2. Description of the Related Art

There is a conventional system described in Japanese Patent Application Laid-open No. 10-325356. According to the system described in the document, it is possible to ensure electric connection between a control component incorporated into an engine and a wire harness, to simplify a connector connecting operation, and to simplify distributing paths of transmission lines around the engine.

However, in the system described in the document, a so-called engine control circuit is disposed on an outside of the engine and/or on an outside of an engine cover. The wire harness of such a system reaches around the engine and is long enough to increase the weight of the whole vehicle and to reduce manufacturing productivity due to complicated assembly.

SUMMARY OF THE INVENTION

It is an object of the present invention to provide a controller integrated with an engine for further simplifying the wire harness.

To achieve the above object, according to one aspect of the present invention, there is provided a controller integrated with an engine and provided to an engine cover that is mounted to an opening at an upper portion of the engine and which closes the opening.

The engine cover comprises an engine cover lower portion mounted to the opening and an engine cover upper portion mounted to the engine cover lower portion and covering an obverse of the engine cover lower portion.

The engine cover lower portion is provided with engine control components such as various sensors, an engine control circuit for controlling the engine with a signal from the engine control components, a circuit protecting component for protecting the engine control circuit from overload, and a power distributing board for distributing and supplying vehicle-installed power.

The engine control components, the engine control circuit, the circuit protecting component, and the power distributing board are covered with the engine cover upper portion.

According to the invention, because the engine control components such as the various sensors, the engine control circuit, the circuit protecting component, and the power distributing board are mounted to the engine cover lower portion and are covered with the engine cover upper portion, it is possible to simplify distributing paths of transmission lines around the engine and to prevent deterioration of the transmission lines. It is also possible to further simplify distribution of a wire harness to reduce weight and to prevent reduction in productivity due to assembly.

In a preferred embodiment of the invention, the engine control components, the engine control circuit, the circuit protecting component, and the power distributing board are housed in a circuit box that is an electric conductor, and the circuit box is connected to the engine or a vehicle body in a conductive manner.

According to this embodiment, the circuit box that is the electric conductor functions as a case for intercepting electromagnetic wave interference from outside to protect the control circuit and the like from ignition noise from the engine.

In a preferred embodiment of the invention, the engine control components, the engine control circuit, and the circuit protecting component are installed on the power distributing board and housed in the circuit box, and shock absorbing material is provided between the power distributing board and the circuit box.

According to this embodiment, vibration from the outside can be absorbed by the shock absorbing material between the board and the circuit box and it is possible to protect the engine control circuit and the like from vibration from an engine main body and from vibration caused by traveling of the vehicle.

In a preferred embodiment of the invention, the engine control components, the engine control circuit, and the circuit protecting component are installed on the power distributing board and housed in the circuit box, the engine control circuit has a radiating plate, the circuit box has a window through which the radiating plate is exposed to an outside of the circuit box, and the engine cover upper portion and lower portion form a hollow duct therebetween and have an intake opening and an exhaust opening communicating with an outside of the cover.

According to this embodiment, heat generated by the engine control circuit can be radiated to the outside of the circuit box through the window of the circuit box by using the radiating plate. Outside air can be drawn through the intake opening in the hollow duct formed between the engine cover upper portion and lower portion and can be exhausted through the exhaust opening for efficient cooling.

In a preferred embodiment of the invention, the radiating plate has waterproofing packing in close contact with a peripheral edge portion of the window.

According to this embodiment, it is possible to prevent water and dust from entering through the window of the circuit box by the waterproofing packing and to reliably protect the engine control circuit and the like.

In a preferred embodiment of the invention, a wall portion to be fitted with a peripheral edge of the engine cover lower portion from an outside is provided to a peripheral edge of the engine cover upper portion.

According to this embodiment, because the wall portion at the peripheral edge of the engine cover upper portion is fitted with the peripheral edge of the engine cover lower portion from the outside, it is possible to easily prevent entering of water, dust, and the like and to further reliably protect the inside engine control circuit and the like.

In a preferred embodiment of the invention, the engine control components, the engine control circuit, and the circuit protecting component are installed on the power distributing board, the engine control circuit has a terminal printed on a board, and the power distributing board has a slot-type connector for connection of the terminal printed on the board and a guide rail for guiding and retaining the engine control circuit in connecting the terminal printed on the board to the slot-type connector.

According to this embodiment, by guiding the engine control circuit along the guide rail to retain the engine control circuit on the power distributing board, the terminal printed on the board of the engine control circuit is connected to the slot-type connector of the board and the engine control circuit can be directly and easily connected to the board.

In a preferred embodiment of the invention, the engine control components, the engine control circuit, and the circuit protecting component are installed on the power distributing board, the power distributing board has an ignition coil connecting connector in an upward orientation for an ignition coil as the engine control component, and the ignition coil has a plug portion to be connected to the ignition coil connecting connector in a downward orientation.

According to this embodiment, it is possible to directly and easily connect the plug portion of the ignition coil in the downward orientation to the ignition coil connecting connector in the upward orientation.

In a preferred embodiment of the invention, the engine cover upper portion has an ignition coil mounting opening for the ignition coil and a circuit protecting component drawing out opening for the circuit protecting component which are passing through the engine cover upper portion and has a mounting opening cover with which an upper portion of the ignition coil mounting opening is covered and a drawing out opening cover with which an upper portion of the circuit protecting component drawing out opening is covered.

According to this embodiment, it is possible to mount the ignition coil through the ignition coil mounting opening and to draw the circuit protecting component out through the circuit protecting component drawing out opening in a state in which the engine cover upper portion is mounted to the engine cover lower portion. Furthermore, it is possible to cover the ignition coil mounting opening with the mounting opening cover and to cover the circuit protecting component drawing out opening with the drawing out opening cover, thereby reliably protecting the ignition coil and the circuit protecting component.

In a preferred embodiment of the invention, wall portions to be fitted with the engine cover upper portion are provided to peripheral edges of the mounting opening cover and the drawing out opening cover.

According to this embodiment, because the wall portions on the peripheral edges of the mounting opening cover and the drawing out opening cover are fitted with the engine cover upper portion, it is possible to easily prevent entering of water, dust, and the like and to further reliably protect the ignition coil and the circuit protecting component.

Also, to achieve the above object, according to one aspect of the present invention, there is provided a circuit board package used in a controller integrated with an engine and provided to an engine cover that is mounted to an opening at an upper portion of said engine and closes said opening, the circuit board package comprising: a flexible printed circuit board having a predetermined pattern formed thereon; a control circuit board mounted on the flexible printed circuit board, for controlling an engine; a circuit protecting component mounted on the flexible printed circuit board, for protecting the control circuit board from an overload; and a connector block provided on the flexible printed circuit board and electrically connected with the control circuit board, engine control components, and various sensors.

According to the invention, the use of the flexible printed circuit board reduces the number of electrical connections between the engine control circuit and the engine control components, thereby simplifying assembly. In addition, a reduction in weight and cost of the controller integrated with engine is achieved.

In a preferred embodiment of the invention, the predetermined pattern includes a power distributing wiring pattern.

According to this embodiment, since a power distributing wiring pattern is included in the predetermined pattern, the mounting of the engine control circuit board is easily and surely performed.

In a preferred embodiment of the invention, an arrangement of a pad portion of a wiring pattern connected with the connector block is formed corresponding to an arrangement of a circuit pattern of the engine control components.

According to this embodiment, since the arrangement of the pad portion of the flexible printed circuit board and the arrangement of the connection pad portion of the engine control components are coordinated with each other, the structure of a wire harness which connects the engine control components with the connector block is simplified and the production thereof becomes less complicated.

The nature, principle and utility of the invention will become more apparent from the following detailed description when read in conjunction with the accompanying drawings.

DESCRIPTION OF THE PREFERRED EMBODIMENTS

Embodiments according to the present invention will be explained hereinunder in detail with reference to the accompanying drawings.

First Embodiment

Figure 1:
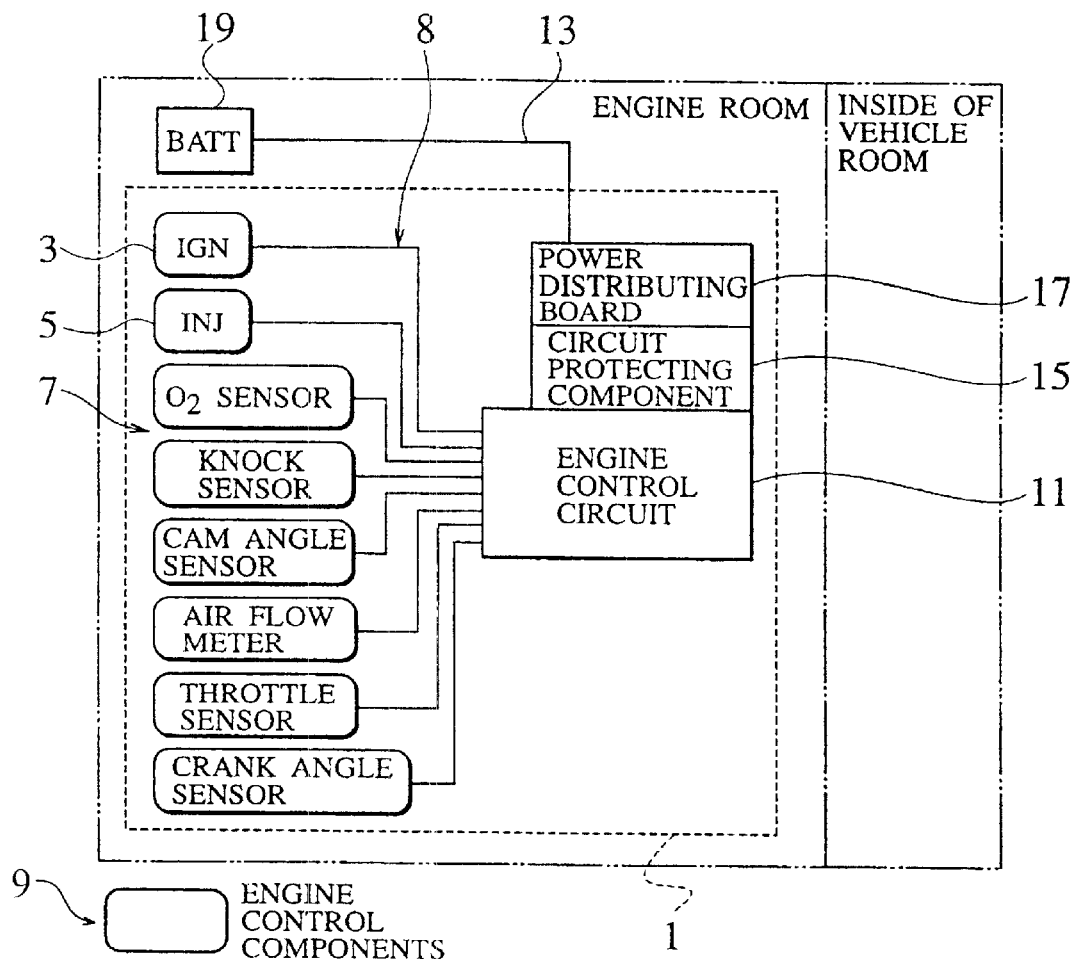
FIG. 1 is a block diagram of a first embodiment of the present invention.

FIG. 1 is a schematic block diagram of a first embodiment of the present invention.

In this first embodiment, an ignition coil 3, an injector 5, various sensors 7 such as an $O_2$ sensor, which are engine control components 9, are mounted to an engine cover mounted to an opening at an upper portion of an engine 1 and are electrically connected through transmission lines 8 in the engine to connecting terminals (not shown) provided in close contact with an outer portion of the engine 1. In the embodiment in particular, an engine control circuit 11, a circuit protecting component 15, and a power distributing board 17 in addition to the above engine control components 9 are mounted within the engine cover to form the controller integrated with the engine.

The ignition coil 3, the injector 5, and the various sensors 7 are connected to the engine control circuit 11 through the transmission lines 8 in the engine cover and a wire harness 13 extends by an extremely short distance between a connecting terminal (not shown) mounted in close contact with the engine cover and a power source 19. Therefore, it is possible to simplify distributing paths of the transmission lines 8 around the engine and to prevent deterioration of the transmission lines 8. Moreover, because the wire harness 13 is remarkably simplified and shortened, it is possible to reduce the weight of a whole vehicle, to reduce the cost, and to facilitate assembly, thereby enhancing productivity.

Figure 2:
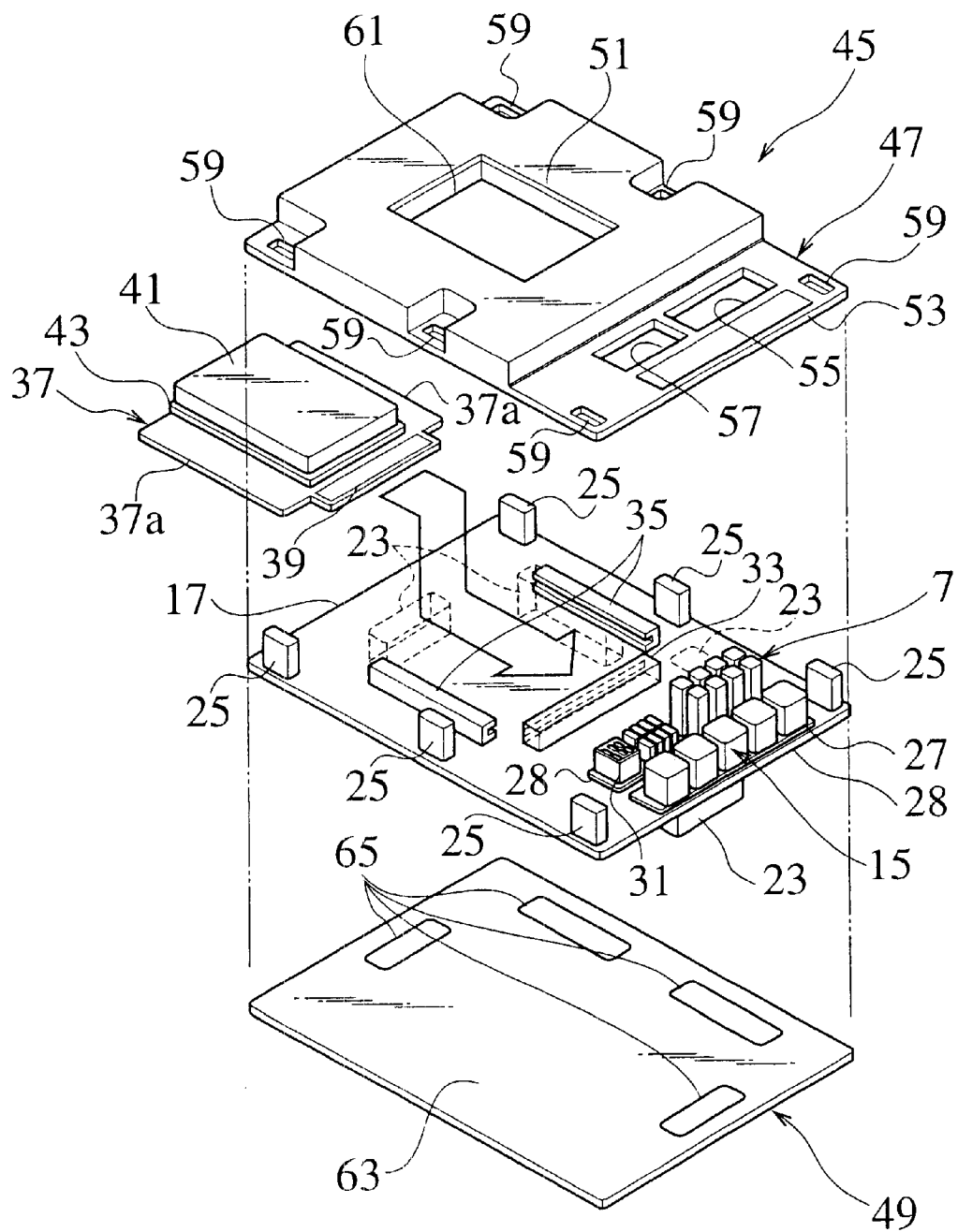
FIG. 2 is an exploded perspective view of an upper portion and a lower portion a circuit box and a board.
Figure 3:
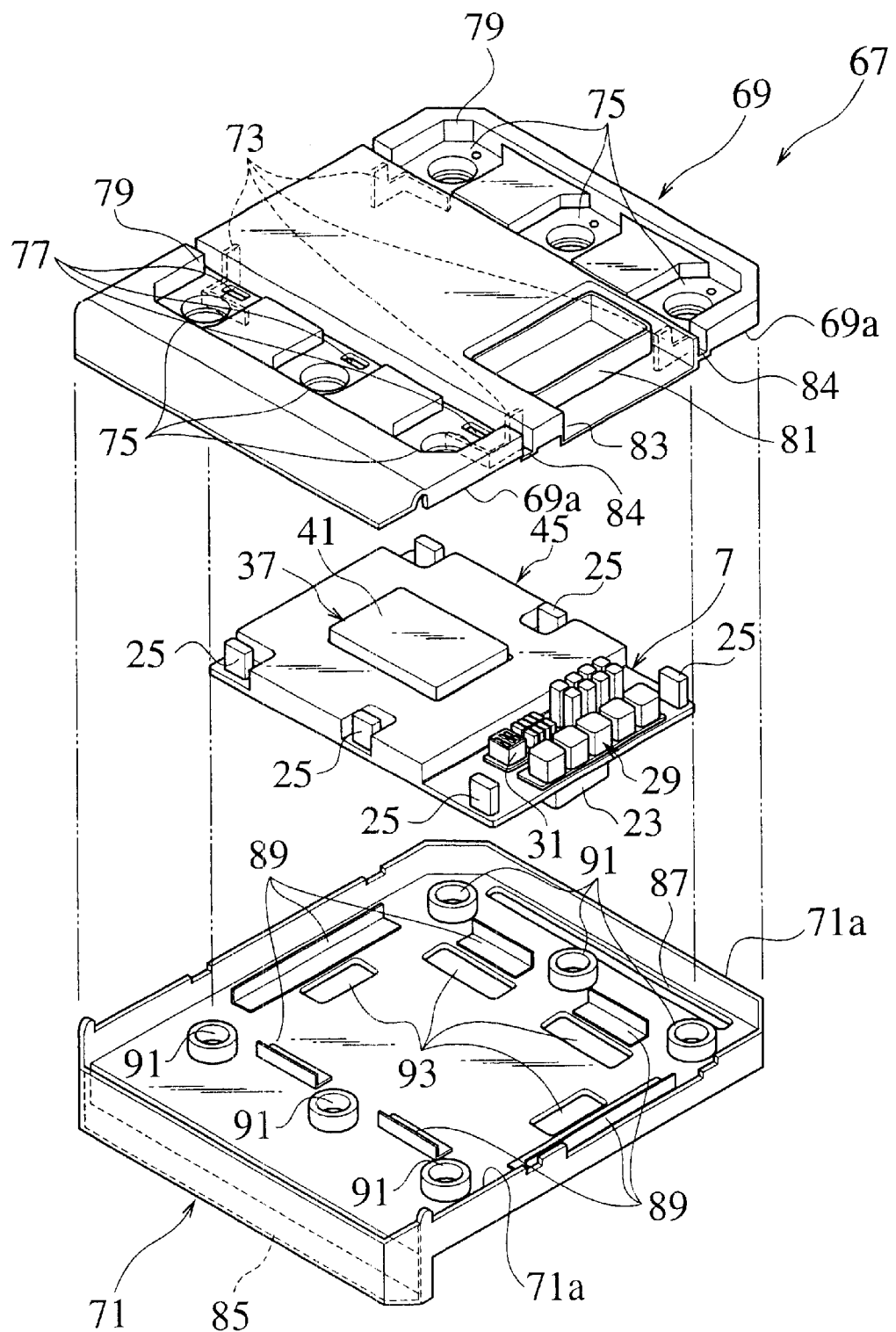
FIG. 3 is an exploded perspective view of the circuit box and an upper portion and a lower portion of an engine cover.
Figure 4:
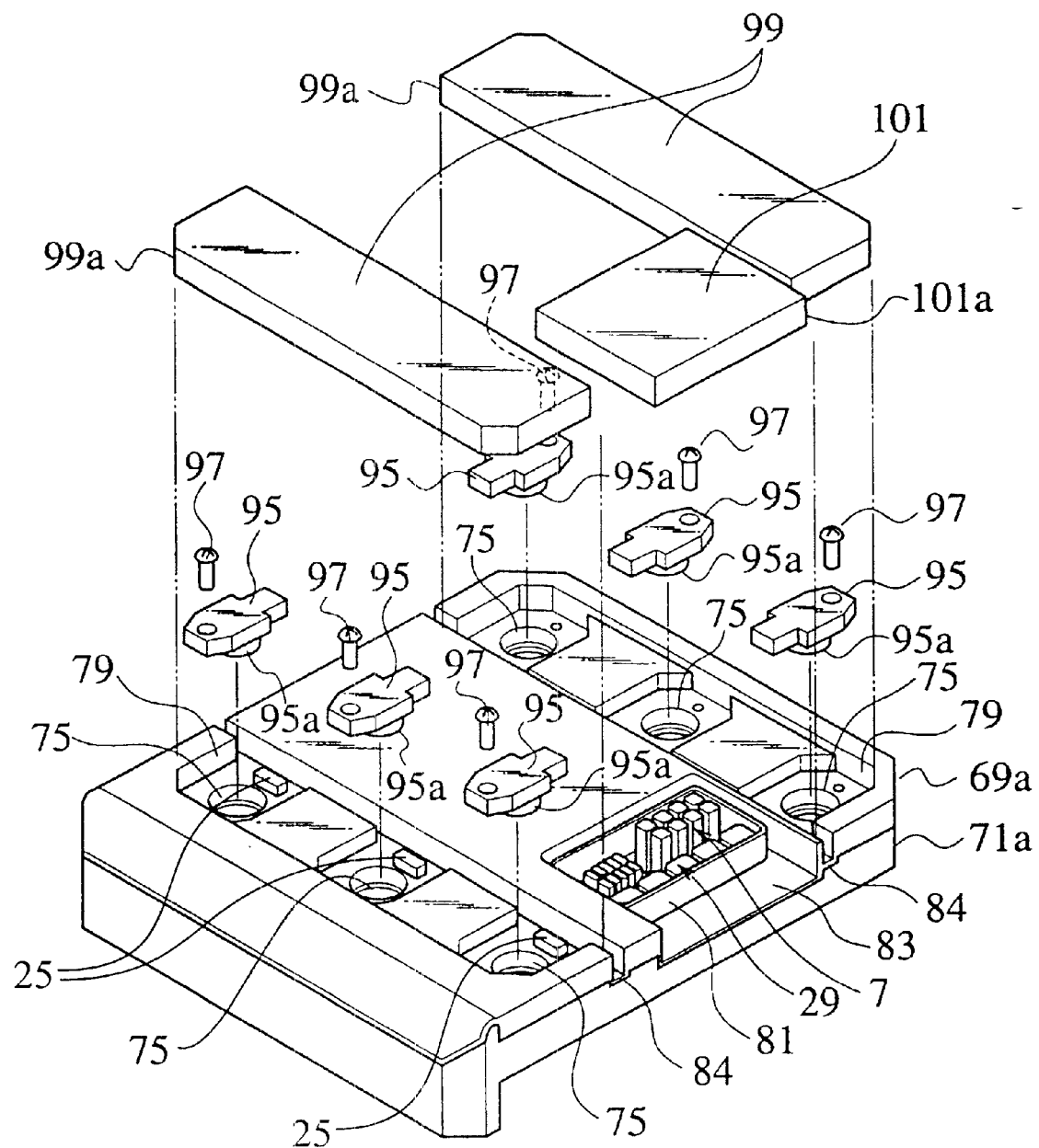
FIG. 4 is an exploded perspective view of the engine cover and components on an upper portion of the engine cover.

FIGS. 2 to 4 show a specific structure in which FIG. 2 is an exploded perspective view of the circuit box and the power distributing board, FIG. 3 is an exploded perspective view of a relationship between the circuit box, the power distributing board, and the engine cover, and FIG. 4 is an exploded perspective view showing a structure of an upper portion of the engine cover in a state in which the engine cover upper portion and lower portion are assembled.

As shown in FIG. 2, a connector 23 for connecting the wire harness is mounted to the reverse of the power distributing board 17. A connecting connector 25 for the ignition coil is provided in an upward orientation to a peripheral edge of the obverse of the power distributing board 17.

The circuit protecting component 15 such as a fuse and a fusible link is mounted to a circuit protecting component mounting portion 27 on one side in a longitudinal direction of the obverse of the power distributing board 17. On an inner side of the circuit protecting component 15, an engine diagnosis connector 31 is mounted. The various sensors 7 such as the O₂ sensor are mounted to be adjacent to the engine diagnosis connector 31.

A slot-type connector 33 is provided to a central portion of the obverse of the power distributing board 17. The slot-type connector 33 is connected in a conductive manner to the various sensors 7 which are the engine control components through printed wiring as transmission lines (not shown). Guide rails 35 extend on opposite sides of the slot-type connector 33.

The control circuit board 37 is mounted with the engine control circuit 11, has a board-printed-type terminal 39 on a front end thereof, and has a radiating plate 41 for the engine control circuit 11 on the obverse thereof. At a periphery of the radiating plate 41, a waterproofing packing 43 is provided. Opposite edge portions 37a of the control circuit board 37 are inserted in a direction shown by an arrow as they are guided by the guide rails 35, thereby connecting the terminal 39 to the slot-type connector 33.

The power distributing board 17 is housed in the circuit box 45. The circuit box 45 has a structure in which the circuit box upper portion 47 and the circuit box lower portion 49 are put together.

The circuit box upper portion 47 has a window 51 through which the radiating plate 41 is exposed to an outside of the circuit box 45 and has a circuit protecting component drawing out opening 53, a sensor drawing out opening 55, and a connector opening 57 are provided. Ignition coil connector passing through openings 59 are provided on peripheral edge portions of the circuit box upper portion 47. A portion of the circuit box upper portion 47 around the window 51 is bulging upward and shock absorbing material 61 is provided to the reverse side of the portion. The shock absorbing material 61 provides shock absorption between the power distributing board 17 and the circuit box 45.

The circuit box lower portion 49 is provided at the obverse thereof with shock absorbing material 63. The shock absorbing material 63 provides shock absorption between the power distributing board 17 and the circuit box 45 together with the shock absorbing material 61. Openings 65 for drawing out the connectors 23 for connecting the wire harness are provided to the circuit box lower portion 49.

The circuit box upper portion 47 and lower portion 49 are put together with the power distributing board 17 sandwiched therebetween, the wire harness connecting connectors 23 are caused to project downward through the drawing out openings 65, and the ignition coil connecting connectors 25 are caused to project upward through the connector passing through openings 59 on the circuit box upper portion 47. The radiating plate 41 projects through the window 51 and the circuit protecting component 15, the various sensors 7, the engine diagnosis connector 31 project respectively upward through the drawing out openings 53, 55, and 57.

Although the circuit box upper portion 47 and the circuit box lower portion 49 may be connected to each other by bonding, they may be also fastened together when they are fixed to the engine 1 in a conductive state by using fixing bolts (not shown).

An assembled state of the circuit box 45 and the control circuit board 37 is shown in FIG. 3. FIG. 3 also shows the engine cover 67.

The engine cover 67 is formed from an engine cover upper portion 69 and an engine cover lower portion 71. Circuit box fixing portions 73 are formed to project from the reverse of the engine cover upper portion 69. The circuit box fixing portions 73 are respectively formed in key shapes to position respective corners of the circuit box 45.

Three ignition coil mounting openings 75 and three ignition coil connector connecting openings 77 are provided to each of left and right sides of the obverse of the engine cover upper portion 69.

However, only three of the ignition coil connector connecting openings 77 on one side are shown for convenience in expression in the drawing.

Portions where the ignition coil mounting openings 75 and the ignition coil connector connecting openings 77 are provided are formed as recessed portions 79 on the obverse of the engine cover upper portion 69. A circuit protecting component drawing out opening 81 is provided to one side of a center of the engine cover upper portion 69 and a periphery of the circuit protecting component drawing out opening 81 is also formed as a recessed portion 83.

A wall portion 69a to be fitted with a peripheral edge 71a of the engine cover lower portion 71 from an outside is provided to a peripheral edge of the engine cover upper portion 69. A drain groove 84 is provided to the engine cover upper portion 69.

An intake opening 85 and an exhaust opening 87 communicating with the outside of the cover are provided to the engine cover lower portion 71. Circuit box fixing portions 89 are provided to the obverse of the engine cover lower portion 71. Ignition coil mounting openings 91 are provided to the engine cover lower portion 71 to correspond to the ignition coil mounting openings 75 of the engine cover upper portion 69. Wire harness connecting connector drawing out openings 93 are provided to the engine cover lower portion 71 on an inner side of the circuit box fixing portions 89.

The circuit box 45 is mounted to the circuit box fixing portions 89 of the engine cover lower portion 71 and the engine cover upper portion 69 is mounted to the engine cover lower portion 71. At this time, the circuit box fixing portions 89 fix a periphery of the circuit box 45 and the circuit box fixing portions 73 fix the corners of the circuit box 45.

The wire harness connecting connectors 23 project downward through the drawing out openings 93 and the ignition coil connecting connectors 25 project through the ignition coil connector connecting openings 77. The circuit protecting component 15, the various sensors 7, and the engine diagnosis connector 31 are exposed through the circuit protecting component drawing out opening 81.

The wall portion 69a of the engine cover upper portion 69 is fitted with the peripheral edge 71a of the engine cover lower portion 71 from an outside. In this manner, a hollow duct is formed within the engine cover 67.

As shown in FIG. 4, the ignition coils 95 are mounted to the respective mounting openings 75 on the engine cover upper portion 69 and are fixed to the engine cover upper portion 69 by using screws 97. Each the ignition coil 95 has a plug portion 95a in a downward orientation to be connected to the ignition coil connecting connector 25.

Upper portions of the ignition coils 95 are covered with mounting opening covers 99. A wall portion 99a is provided to a peripheral edge of each the mounting opening cover 99 and is fitted into a recessed portion 79 of the engine cover upper portion 69. An upper portion of the circuit protecting component drawing out opening 81 is covered with a drawing out opening cover 101. A wall portion 110a is provided to a peripheral edge of the drawing out opening cover 101 such that the wall portion 101a is neatly fitted in a recessed portion 83.

Therefore, with the above structure, not only the engine control components 3, 5, and 7 but also the engine control circuit 11, the circuit protecting component 15, and the power distributing board 17 are mounted in the engine cover 67 and the above operations and effects can be obtained.

Other characteristic points are as follows.
(a) Protection of Circuit Components from Ignition Noise from the Engine The circuit box 45 is made of electric conductor, e.g., metal plate or a conductive resin molded body. By assembling the circuit box upper portion 47 and the circuit box lower portion 49, the whole circuit box 45 functions as a case for intercepting electromagnetic wave from the outside. A ground is established by connecting the power distributing board 17 to the engine main body or a vehicle body through the fixing bolts in fixing the power distributing board 17 to the circuit box 45 as described above.

Therefore, it is possible to reliably protect the engine control circuit 11 and the like from the ignition noise from the engine.
(b) Protection of the Circuit Components from Vibration from the Engine Main Body and Vibration in Traveling of the Vehicle The circuit box 45 has the shock absorbing material 61 and 63 at the fixing portions for mounting the power distributing board 17 to protect the enclosed power distributing board 17 from vibration from the outside. Therefore, it is possible to reliably protect the engine control circuit 11 and the like from the vibration from the engine 1 and the vibration in traveling of the vehicle.
(c) Cooling Against Heat Generated from the Control Circuit The control circuit board 37 has the radiating plate 41 for radiating heat generated from constituting elements. The circuit box 45 has the window 51 through which the radiating plate 41 is exposed to the outside of the box and the assembled state is as shown in FIG. 3. The engine cover 67 forms the hollow duct shape when assembled and has the intake opening 85 and the exhaust opening 87. By fixing the circuit box 45 to the engine cover 67, it is possible to efficiently cool heat generated from the control circuit board 37. Needless to say, positive pressure or negative pressure of an outside radiator fan is utilized for a flow of air and an efficient structure is employed for the intake opening 85 according to conditions of the vehicle. Therefore, it is possible to efficiently cool the heat generated from the engine control circuit 11 and the like.
(d) Protection of the Circuit Components from Water and Dust from an Outside of the Vehicle The radiating plate 41 mounted to the control circuit board 37 and the various connectors 23, 25, the circuit protecting component mounting portion 27, and the engine diagnosis connector 31 mounted to the power distributing board 17 as a power distributor have the waterproofing packing 28 and 43. When the control circuit board 37 and the power distributing board 17 are mounted to the circuit box 45, the waterproofing packing 28 and 43 is caught in the circuit box 45 to prevent water and dust from entering from the outside.

Because the wall portion 69a of the engine cover 69 is mounted to surround the peripheral edge 71a of the engine cover lower portion 71 from an outside, a simple waterproofing structure for preventing water and dust from entering from an upper face and side faces is formed.

Furthermore, the mounting opening cover 99 and the mounting opening cover 101 is provided with a similar simple waterproofing structure by fitting the wall portions 99a and 101a thereof in the recessed portions 79 and 83 and the drain groove 84 also exists.

Therefore, with the above structures, it is possible to suppress entering of water, dust, and the like from the ignition coil mounting openings 75 and the circuit protecting components drawing out opening 81 and to further reliably protect the engine control circuit 11 and the like from water and dust from the outside of the car.
(e) Direct Connection of the Control Circuit and the Circuit Protecting Components The control circuit board 37 and the circuit protecting component 15 are installed on the power distributing board 17 to carry out power distribution. For direct connection of the control circuit board 37, an electric connecting portion is the board-printed-type terminal 39. The power distributing board 17 for carrying out power distribution has the slot-type connector 33 for connection to the terminal 39 and the guide rail 35 for assisting guiding of the control circuit board 37. Therefore, it is possible to easily and reliably carry out direct connection between the engine control circuit 11 provided to the control circuit board 37 and the circuit protecting component 15 on the power distributing board 17.
(f) Direct Connection of the Ignition Coils and the Power Distributing Board For direct connection of the ignition coils 95 and the power distributing board 17 as the power distributor, the power distributing board 17 has the ignition coil connecting connectors 25 in upward orientations and the ignition coils 95 have the plug portions 95a thereof in downward orientations, thereby making direct connection easy and reliable.

Second Embodiment

A second embodiment of the present invention will be explained with reference to FIGS. 5 to 8.

Figure 5:
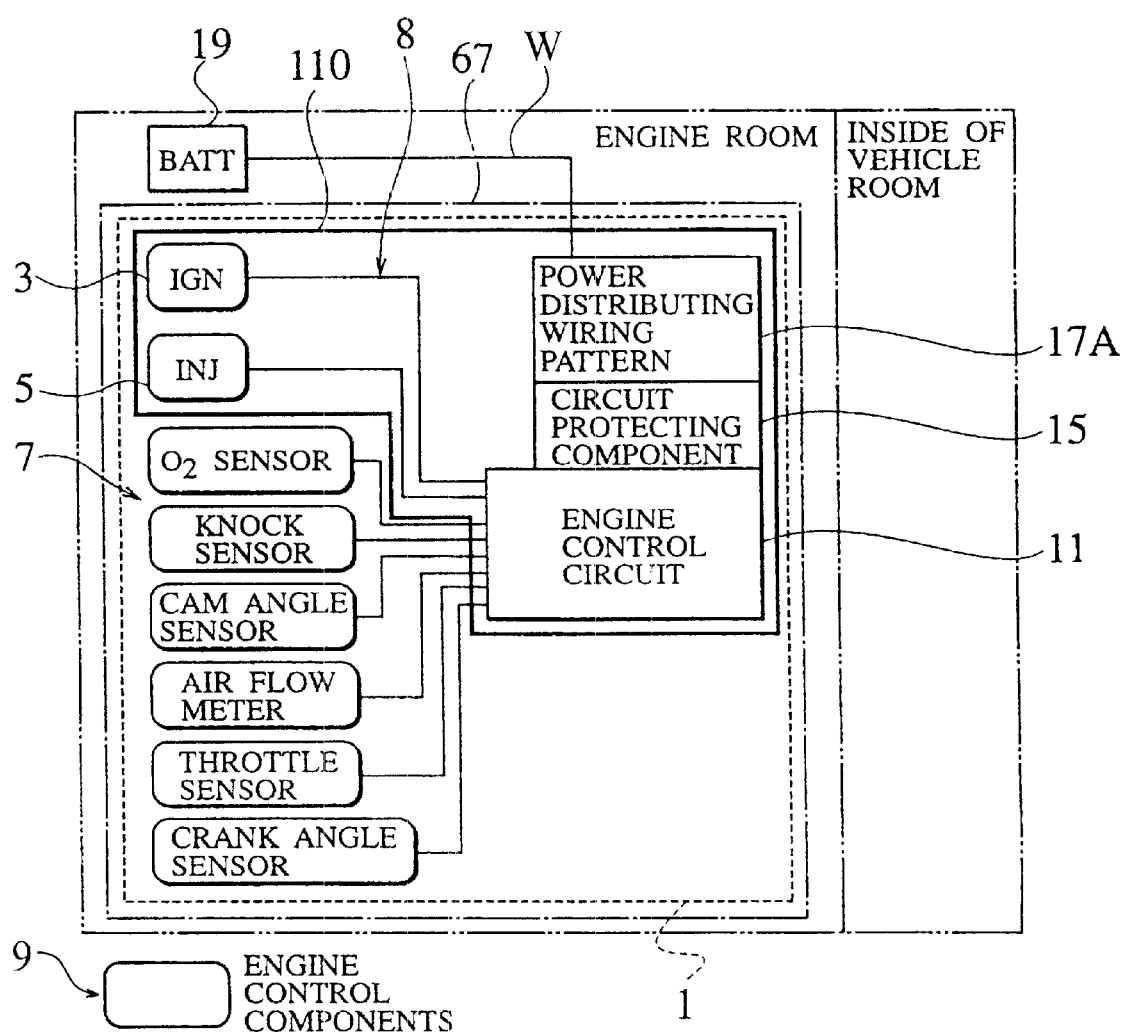
FIG. 5 is a block diagram of a second embodiment of the present invention.
Figure 6:
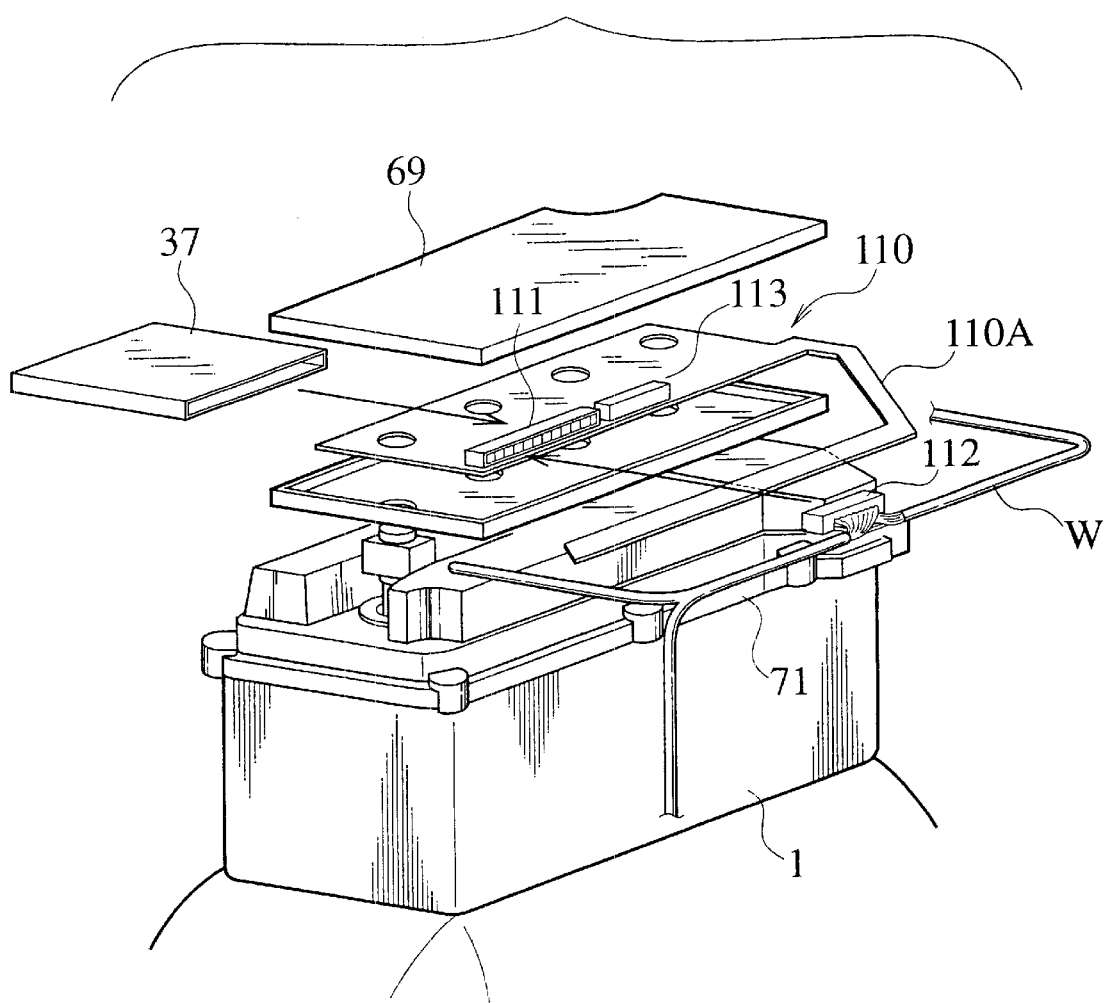
FIG. 6 is an exploded perspective view of a controller integrated with an engine according to the second embodiment of the present invention.
Figure 7:
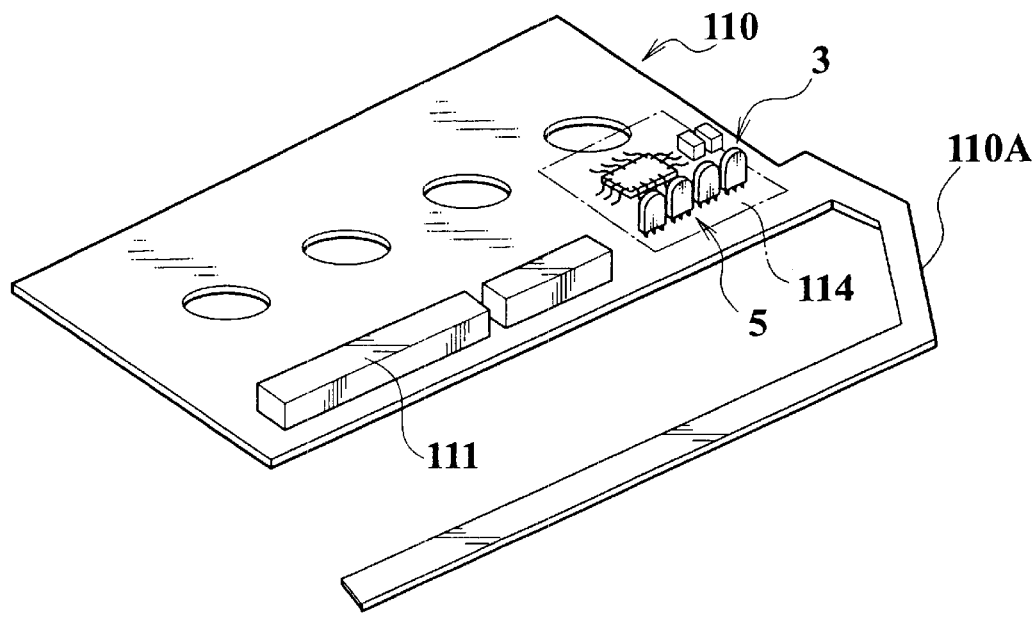
FIG. 7 is a perspective view of a flexible printed circuit board according to the second embodiment.
Figure 8:
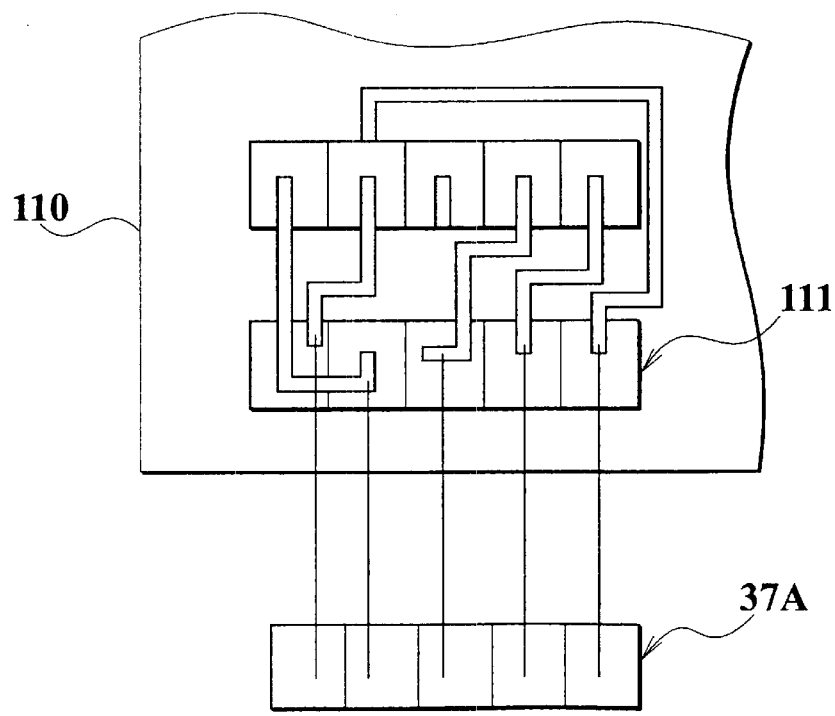
FIG. 8 is an explanatory and plane view of a terminal arrangement of a connector block at the flexible printed circuit board end and an arrangement of connecting terminals of a control circuit board according to the second embodiment.

This second embodiment includes a circuit boards package according to the present invention. The same parts of the controller integrated with the engine in the second embodiment as the parts in the first embodiment are assigned with the same reference numerals for convenience of explanation. FIG. 5 is a block diagram of a second embodiment of the present invention. FIG. 6 is an exploded perspective view of a controller integrated with an engine of the second embodiment of the present invention. FIG. 7 is a perspective view of a flexible printed circuit board (referred to as a FPC hereunder). FIG. 8 is an explanatory and plane view of a terminal arrangement of a connector block at the flexible printed circuit board end and an arrangement of connecting terminals of a control circuit board according to the second embodiment.

As shown in FIG. 5, in this second embodiment, a FPC 110 is housed and arranged in the engine cover 67 of the engine 1. The wiring pattern (not shown) and the power distributing wiring pattern 17A are formed on the FPC 110. The control circuit board 37 equipped with the engine control circuit 11 and the circuit protecting component 15, as well as the engine control components 9, such as the ignition coil 3, and the injector 5, are mounted on the FPC 110, and thus the controller integrated with the engine is constituted.

As shown in FIG. 7, the ignition coil 3, the injector 5, etc., mounted on the FPC 110 are connected to the wiring pattern formed in the FPC 110. As shown in the same figure, a heat-dissipating plate 114 such as a metal having high thermal conductivity is equipped on an area on which exothermic electrical parts are mounted, on the FPC 110, to accelerate the dissipation of heat. The facilities of the dissipation of heat enables the FPC 110 to mount the above parts in high density and to minimize itself. The control circuit board 37 is connected to a connector block 111 equipped on the FPC 110 and connected to the wiring pattern thereon. One end of wire harness W, the other end thereof is connected to the various sensors 7, is connected to the connector block 111 via a harness end connector 112 (see FIG. 6). Also in this second embodiment, the wire harness W extends by an extremely short distance between a connecting terminal (not shown) mounted in close contact with the engine cover and a power source 19. Therefore, it is possible to simplify distributing paths of the wire harness W around the engine. Moreover, because the wire harness 13 is remarkably simplified and shortened, it is possible to prevent an increase in weight of a whole vehicle and an increase in cost and to facilitate assembly, thereby enhancing productivity.

Further, the FPC 110 is equipped with a branching circuit board 110A as shown in FIG. 6. For example, the branching circuit board 110A may be connected to a power supply, or may be used as a grounding wiring. Also, the FPC 110 is equipped with a sub wire harness connector 113 which is used in designing that the number of sensors to be connected is increased and that a connecting terminal may be selected according to the type of a sensor to be connected.

FIG. 8 shows wiring terminals of the connector block on the FPC 110 and an arrangement of the connecting terminal part 37A on the control circuit board 37 end. In this embodiment, the wiring pattern in the FPC 110 is formed to correspond to the arrangement of the connecting terminal part 37A on the control circuit board 37 end. Therefore the control circuit board 37 is easily and surely connected to the FPC 110, thereby largely improving the efficiency of connection operation.

As described above, circuit distribution is performed by employing the FPC 110. This enables the number of the electrical connections from the control circuit board 37 for controlling the engine to auxiliary units to reduce, thereby accomplishing reduction in both size and cost. Specifically, in a conventional controller, since circuit distributing components are connected to a connector at a control circuit end through a wire harness, the number of connections of the wire harness increase, and thus the weight of the wire harness increased as well as the cost thereof rises. In contrast, according to this embodiment, since a wire harness between the control circuit board 37 and the FPC 11 can be eliminated by employing the FPC 110, reduction in both size and cost is accomplished.

Also, the employment of the FPC 110 eliminates operations of cutting electric cords, peeling of an insulting coating, attaching terminals, operation of housing the terminals in a terminal case, and operation of distributing, which are necessary for an wire harness. Thus reduction in operation cost is realized.

Other constitutions of the second embodiment are the same as those of the first embodiment.

It should be understood that many modifications and adaptations of the invention will become apparent to those skilled in the art and it is intended to encompass such obvious modifications and changes in the scope of the claims appended hereto.

What is claimed is:

1. A controller integrated with an engine, said controller comprising:
   an engine cover mounted to and closing an opening at an upper portion of said engine, said engine cover comprising:
      an engine cover lower portion mounted to said opening, said engine cover lower portion comprising:
         at least one engine control component,
         an engine control circuit for controlling said engine via signals from said at least one engine control component,
         a circuit protecting component for protecting said engine control circuit from overload, and
         a power distributing board for supplying and distributing vehicle-installed power; and
      an engine cover upper portion mounted to said engine cover lower portion and covering an obverse of said engine cover lower portion,
   wherein said engine cover upper portion covers said at least one engine control component, said engine control circuit, said circuit protecting component, and said power distributing board.

2. The controller of claim 1, wherein said engine cover further comprises a circuit box comprising an electrical conductor, the circuit box housing said at least one engine control component, said engine control circuit, said circuit protecting component, and said power distributing board, wherein said circuit box is connected to said engine in a conductive manner.

3. The controller of claim 2, wherein said at least one engine control component, said engine control circuit, and said circuit protecting component are installed on said power distributing board, and shock absorbing material is provided between said power distributing board and said circuit box.

4. The controller of claim 1, wherein the engine cover upper portion comprises a wall portion having a peripheral edge, and said engine cover lower portion further comprises a peripheral edge, wherein said peripheral edge of said wall portion and said peripheral edge of said engine cover lower portion are fifted together.

5. The controller of claim 1, wherein said at least one engine control component, said engine control circuit, and said circuit protecting component are installed on said power distributing board, said engine control circuit comprises a terminal printed on a board, and said power distributing board comprises a slot-type connector for connecting to said terminal, and a guide rail for guiding and retaining said engine control circuit in said slot-type connector.

6. The controller of claim 1, wherein said at least one engine control component, said engine control circuit, and said circuit protecting component are installed on said power distributing board, wherein said power distributing board comprises an ignition coil connecting connector for connecting to an ignition coil plug portion.

7. The controller of claim 1, wherein said engine cover upper portion comprises:

an ignition coil mounting opening for receiving an ignition coil;

a circuit protecting component drawing out opening for receiving said circuit protecting component;

a mounting opening cover with which an upper portion of said ignition coil mounting opening is covered; and a drawing out opening cover with which an upper portion of said circuit protecting component drawing out opening is covered.

8. The controller of claim 7, wherein said mounting opening cover and said drawing out opening cover comprise wall portions having peripheral edges for fitting to said engine cover upper portion.

9. A controller integrated with an engine, said controller comprising:

an engine cover mounted to and closing an opening at an upper portion of said engine, said engine cover comprising:

an engine cover lower portion mounted to said opening, said engine cover lower portion comprising:

at least one engine control component, an engine control circuit for controlling said engine via signals from said at least one engine control component, a circuit protecting component for protecting said engine control circuit from overload, and a power distributing board for supplying and distributing vehicle-installed power;

an engine cover upper portion mounted to said engine cover lower portion and covering an obverse of said engine cover lower portion; and a circuit box comprising:

an electrical conductor, said circuit box housing said at least one engine control component, said engine control circuit, said circuit protecting component, and said power distributing board, wherein said circuit box is connected to said engine in a conductive manner, and a window, wherein said at least one engine control component, said engine control circuit, and said circuit protecting component are installed on said power distributing board, and wherein said engine control circuit has a radiating plate exposed to an outside of said circuit box through said window, and said engine cover upper portion and said engine cover lower portion form a hollow duct therebetween and have an intake opening and an exhaust opening communicating with an outside of said cover, wherein said engine cover upper portion covers said at least one engine control component, said engine control circuit, said circuit protecting component, and said power distributing board.

10. The controller of claim 9, wherein said radiating plate comprises waterproofing packing in close contact with a peripheral edge portion of said window.

11. A circuit board package for a controller integrated with an engine having at least one control component and an engine cover that is mounted to and closes an opening at an upper portion of said engine, the circuit board package comprising:

a flexible printed circuit board having a predetermined pattern formed thereon, the flexible printed circuit board comprising:

a control circuit board mounted on the flexible printed circuit board for controlling the engine;

a circuit protecting component mounted on the flexible printed circuit board for protecting the control circuit board from an overload; and a connector block provided on the flexible printed circuit board and electrically connected with the control circuit board, the at least one engine control component, and at least one sensor.

12. The circuit board package of claim 11, wherein the predetermined pattern includes a power distributing wiring pattern.

13. The circuit board package of claim 11, wherein the at least one engine control component comprises a circuit pattern and the predetermined pattern comprises a pad portion having a wiring pattern, wherein the wiring pattern corresponds to the circuit pattern.

* * * * *